(12) United States Patent
Jan et al.

(10) Patent No.: US 11,139,788 B2
(45) Date of Patent: Oct. 5, 2021

(54) MEASURING CURRENT GENERATION CIRCUIT

(71) Applicant: uPI semiconductor corp., Zhubei (TW)

(72) Inventors: Yi-Xian Jan, Zhubei (TW);
Chien-Hsien Tsai, Zhubei (TW);
Kuo-Jen Kuo, Zhubei (TW);
Chao-Chung Huang, Zhubei (TW);
Chien-Kuei Chan, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 10 days.

(21) Appl. No.: 16/903,438

(22) Filed: Jun. 17, 2020

(65) Prior Publication Data
US 2021/0013852 A1 Jan. 14, 2021

(30) Foreign Application Priority Data
Jul. 9, 2019 (TW) .................................. 108124064

(51) Int. Cl.
*H03F 3/45* (2006.01)

(52) U.S. Cl.
CPC .................... *H03F 3/45475* (2013.01); *H03F 2203/45138* (2013.01); *H03F 2203/45288* (2013.01); *H03F 2203/45622* (2013.01)

(58) Field of Classification Search
CPC ..................................................... H03F 3/45
USPC .......................................... 330/69, 252, 260
See application file for complete search history.

(56) References Cited

U.S. PATENT DOCUMENTS

| 5,300,896 | A | * | 4/1994 | Suesserman | ........ | H03F 3/45475 |
| | | | | | | 330/260 |
| 6,617,922 | B2 | | 9/2003 | Kruiskamp | | |
| 6,844,775 | B2 | * | 1/2005 | Doorenbos | ......... | H03F 3/45986 |
| | | | | | | 330/69 |
| 7,126,423 | B1 | | 10/2006 | Kruiskamp | | |
| 7,265,622 | B1 | | 9/2007 | Koike | | |
| 7,453,319 | B2 | | 11/2008 | Gupta et al. | | |
| 2015/0002221 | A1 | * | 1/2015 | Van Helleputte | ... | H03F 3/45941 |
| | | | | | | 330/69 |

* cited by examiner

*Primary Examiner* — Henry Choe
(74) *Attorney, Agent, or Firm* — McClure, Qualey & Rodack, LLP

(57) ABSTRACT

A measuring current generation circuit coupled to a setting resistor is disclosed. The generation circuit includes a first measuring terminal, a second measuring terminal, a first transconductance amplifier, a second transconductance amplifier and an output circuit. The first transconductance amplifier has a first input terminal and a second input terminal. The first input terminal is coupled to one terminal of the setting resistor. The second input terminal is coupled to another terminal of the setting resistor and coupled to the first measuring terminal. The second transconductance amplifier has a third input terminal and a fourth input terminal. The output circuit is coupled to output terminals of the first transconductance amplifier and the second transconductance amplifier respectively and has a first output terminal and a second output terminal. The first output terminal is coupled to the first input terminal. The second output terminal is coupled to the second measuring terminal.

9 Claims, 4 Drawing Sheets

MEASURING CURRENT GENERATION CIRCUIT

BACKGROUND OF THE INVENTION

1. Field of the Invention

The invention relates to current generation; in particular, to a measuring current generation circuit.

2. Description of the Prior Art

In the applications of bioinformatics sensing, AC current control technology is most commonly used to achieve a low current (e.g., nA current level) generating a fixed peak value.

However, the conventional AC current control technology still has the following shortcomings, which need to be overcome:

(1) when the resistive components in the circuit do not match each other, the accuracy of the current generated and the common-mode rejection ratio (CMRR) will be seriously affected, so it is necessary to additionally disposed a trimming resistor, leading to a large number of passive components and increased costs;

(2) since less than half of the generated current actually flows through the coupled output load, the current efficiency is low, making it difficult to apply to wearable devices; and (3) in practical applications, one terminal of the coupled output load needs to be grounded, which causes a low CMRR in an environment with high common-mode noise, which is not easy to overcome.

SUMMARY OF THE INVENTION

Therefore, the invention provides a measuring current generation circuit to effectively solve the above-mentioned problems in the prior art.

An embodiment of the invention is a measuring current generation circuit. In this embodiment, the measuring current generation circuit is coupled to a setting resistor. The generation circuit includes a first measuring terminal, a second measuring terminal, a first transconductance amplifier, a second transconductance amplifier and an output circuit. The first transconductance amplifier has a first input terminal and a second input terminal. The first input terminal is coupled to one terminal of the setting resistor. The second input terminal is coupled to another terminal of the setting resistor and coupled to the first measuring terminal. The second transconductance amplifier has a third input terminal and a fourth input terminal. The output circuit is coupled to output terminals of the first transconductance amplifier and the second transconductance amplifier respectively and has a first output terminal and a second output terminal. The first output terminal is coupled to the first input terminal. The second output terminal is coupled to the second measuring terminal.

In an embodiment of the invention, the third input terminal and the fourth input terminal receive a differential input voltage signal and a cross-voltage of the setting resistor is generated, the cross-voltage is an AC voltage having the same frequency with the differential input voltage signal.

In an embodiment of the invention, the cross-voltage of the setting resistor generates an output current at the setting resistor, and the setting resistor is configured to set an upper limit and a lower limit of a current value of the output current.

In an embodiment of the invention, amplitude and frequency of the output current are determined by the differential input voltage signal.

In an embodiment of the invention, the output circuit includes an addition circuit, a current-to-voltage circuit and an amplifying circuit. The addition circuit is coupled to output terminals of the first transconductance amplifier and the second transconductance amplifier respectively. The current-to-voltage circuit is coupled to the addition circuit. The amplifying circuit is coupled to the current-to-voltage circuit, the first output terminal and the second output terminal respectively.

In an embodiment of the invention, the differential input voltage signal controls a flow direction of the output current.

In an embodiment of the invention, transconductances of the first transconductance amplifier and the second transconductance amplifier are equal, and the cross-voltage of the setting resistor and a voltage difference of the differential input voltage signal are equal, but their polarities are opposite.

In an embodiment of the invention, the measuring current generation circuit further includes a third transconductance amplifier. The third transconductance amplifier is coupled to the output circuit and has a fifth input terminal and a sixth input terminal. The third transconductance amplifier is configured to receive a second differential input voltage signal and generate a third current to the output circuit.

In an embodiment of the invention, a transconductance of the first transconductance amplifier is equal to a sum of transconductances of the second transconductance amplifier and the third transconductance amplifier, a cross-voltage of the setting resistor and a sum of a differential input voltage signal received by the first input terminal and the second input terminal and the second differential input voltage signal are equal, but their polarities are opposite, wherein the differential input voltage signal and the second differential input voltage signal have different frequencies.

Compared to the prior art, the measuring current generation circuit of the invention has two sets of differential input terminals and a set of differential output terminals, the measuring current generation circuit of the invention receives a differential voltage signal through one set of differential input terminals to generate a cross-voltage of the setting resistor with the other set of differential input terminals feedback coupled to the output terminal to generate the output current. In addition, the upper and lower limits of the output current are set through the setting resistor, and the amplitude and frequency of the output current are determined through the inputted AC voltage, so as to achieve an AC current generation circuit with characteristics of no switch, high precision and low current.

Therefore, the measuring current generation circuit of the invention can achieve the following functions and advantages:

(1) it can be achieved without matching resistive components in the circuit, so that the current accuracy can be effectively improved;

(2) the output current generated by the measuring current generation circuit all flows to the output load which the measuring current generation circuit is coupled to, so that the current efficiency can be effectively improved;

(3) only one external setting resistor is needed, so the number of passive components in the circuit can be greatly reduced, and the complexity of the circuit can be also effectively simplified;

(4) the output load which the measuring current generation circuit is coupled to does not need to be grounded, and unidirectional or bidirectional output current can be generated, so that its CMRR in the environment with high common-mode noise can effectively improved, which helps to reduce the common-mode noise in the environment; and (5) multi-frequency (or multi-phase) input voltage signal synthesis can be achieved through a multi-input system (multiple sets of differential input terminals).

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
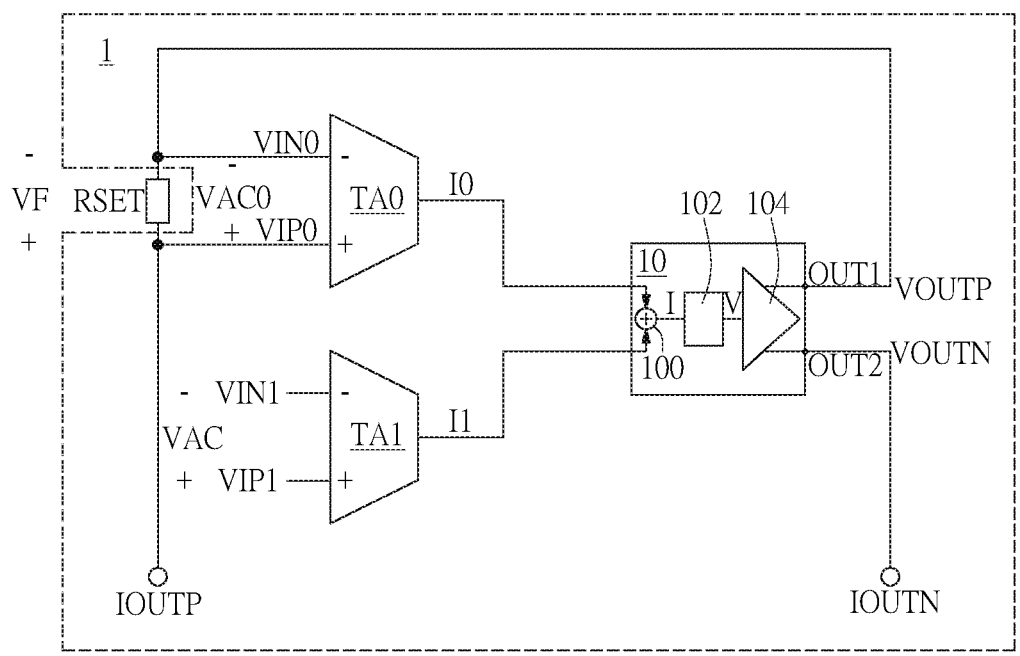
FIG. 1 illustrates a schematic diagram of a measuring current generation circuit in an embodiment of the invention.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment of the invention is a measuring current generation circuit. In this embodiment, the measuring current generation circuit does not need to not only set conventional trimming resistor, but also match the resistive component, it only need to be coupled to an external setting resistor and provide a differential input voltage signal to generate a low alternating current, so that the number of passive components can be effectively reduced and the current accuracy and efficiency can be improved.

Please refer to FIG. 1. FIG. 1 illustrates a schematic diagram of a measuring current generation circuit in this embodiment.

As shown in FIG. 1, the measuring current generation circuit 1 is coupled to the setting resistor RSET. The measuring current generation circuit 1 includes a first measuring terminal IOUTP, a second measuring terminal IOUTN, a first transconductance amplifier TA0, a second transconductance amplifier TA1 and an output circuit 10. The first transconductance amplifier TA0 is coupled to the setting resistor RSET, the first measuring terminal IOUTP and the output circuit 10. The second transconductance amplifier TA1 is coupled to the output circuit 10. The output circuit 10 is coupled to the output terminal of the first transconductance amplifier TA0, the output terminal of the second transconductance amplifier TA1, the set resistance RSET and the second measuring terminal IOUTN.

The first transconductance amplifier TA0 has a first input terminal − and a second input terminal +. The first input terminal − is coupled to one terminal of the setting resistor RSET and coupled to the first output terminal OUT1 of the output circuit 10. The second input terminal + is coupled to the other terminal of the setting resistor RSET and to the first measuring terminal IOUTP. In other words, the first output terminal OUT1 of the output circuit 10 is feedback coupled to the first input terminal − of the first transconductance amplifier TA0, and the first input terminal − and the second input terminal + of the first transconductance amplifier TA0 are coupled to the two terminals of the setting resistor RSET respectively.

When the first input terminal − and the second input terminal + of the first transconductance amplifier TA0 receive the differential input voltage signal VAC0, the first transconductance amplifier TA0 generates a first current I0 to the output circuit 10 according to the differential input voltage signal VAC0. The second transconductance amplifier TA1 has a third input terminal − and a fourth input terminal +. When the third input terminal − and the fourth input terminal + of the second transconductance amplifier TA1 receive the differential input voltage signal VAC, the second transconductance amplifier TA1 generates a second current I1 to the output circuit 10 according to the differential input voltage signal VAC.

Since the first output terminal OUT1 of the output circuit 10 is feedback coupled to the first input terminal − of the first transconductance amplifier TA0, when the third input terminal − and the fourth input terminal + of the second transconductance amplifier TA1 receive the differential input voltage signal VAC, in order to balance the changes of the first current I0 and the second current I1, the output circuit 10 will generate a differential voltage signal VAC0 at the first input terminal − and the second input terminal + of the first transconductance amplifier TA0, and the differential voltage signal VAC0 will be opposite in polarity to the differential input voltage signal VAC. In other words, the differential voltage signal VAC0 is an alternating voltage and has the same frequency as the differential input voltage signal VAC.

In an embodiment, the transconductance of the first transconductance amplifier TA0 and the transconductance of the second transconductance amplifier TA1 are equal to each other, so that the voltage difference between the first input terminal − and the second input terminal + of the first transconductance amplifier TA0 is equal to the voltage difference between the third input terminal − and the fourth input terminal + of the second transconductance amplifier TA1, but their polarities are opposite. In other words, the cross-voltage VF of the setting resistor RSET will be equal to the voltage difference of the differential input voltage signal VAC; that is to say, the voltage VF=(VIN0−VIP0)=(VIP1−VIN1)=the voltage difference of VAC.

In an embodiment, the output circuit 10 includes an addition circuit 100, a current-to-voltage circuit 102 and an amplifying circuit 104, a first output terminal OUT1 and a second output terminal OUT2. The addition circuit 100 is coupled to the output terminal of the first transconductance amplifier TA0 and the output terminal of the second transconductance amplifier TA1 respectively. The current-to-voltage circuit 102 is coupled to the addition circuit 100. The amplifying circuit 104 is coupled to the current-to-voltage circuit 102, the first output terminal OUT1 and the second output terminal OUT2 respectively. The first output terminal OUT1 is coupled to the first input terminal − of the first transconductance amplifier TA0. The second output terminal OUT2 is coupled to the second measuring terminal IOUTN.

The addition circuit 100 receives the first current I0 outputted by the first transconductance amplifier TA0 and the second current I1 outputted by the second transconductance amplifier TA1 respectively and generates a sum current to the current-to-voltage circuit 102 according to the first current I0 and the second current I1. The current-to-voltage circuit 102 converts the sum current I into a sum voltage V and outputs the sum voltage V to the amplifying circuit 104. The amplifying circuit 104 generates differential output voltages VOUTP and VOUTN at the first output terminal OUT1 and the second output terminal OUT2 according to the sum voltage V.

Figure 2:
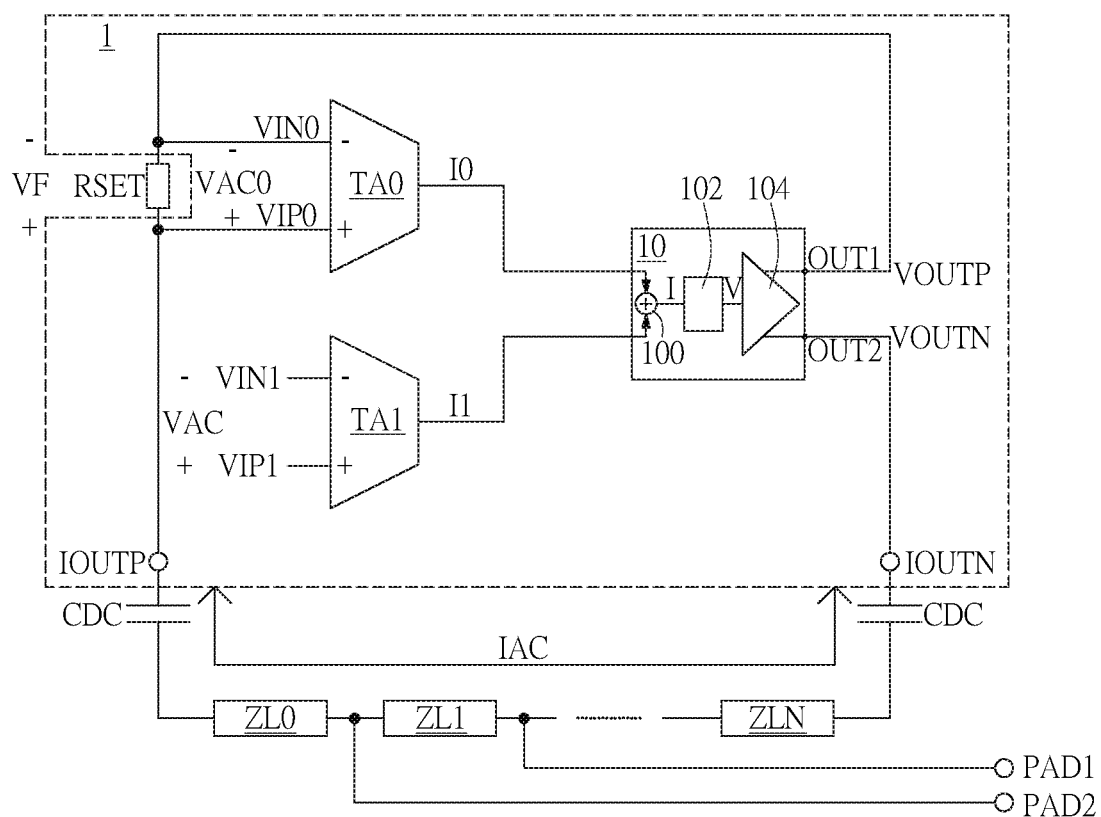
FIG. 2 illustrates a schematic diagram of the measuring current generation circuit in FIG. 1 coupled to an output load and generating an output current to the output load.

Please refer to FIG. 2. FIG. 2 illustrates a schematic diagram of the measuring current generation circuit 1 in FIG. 1 coupled to an output load and generating an output current to the output load.

As shown in FIG. 2, the measuring current generation circuit 1 generates a cross-voltage VF of the setting resistor RSET and generates an output current IAC through the setting resistor RSET; that is to say, IAC=VF/RSET= (VIN0−VIP0)/RSET. When the subjects to be measured (i.e., the output loads ZL0~ZLN) are coupled between the first measuring terminal IOUTP and the second measuring terminal IOUTN, there is an output current IAC between the first measuring terminal IOUTP and the second measuring terminal IOUTN flows through the output loads ZL0~ZLN. The capacitor CDC is used to isolate the direct current (DC) voltage, so that only the AC output current IAC can flow through the output loads ZL0~ZLN coupled in series, but not limited to this.

In practical applications, the output current IAC generated by the measuring current generation circuit 1 is related to the differential input voltages VIN1 and VIP1 received by the third input terminal − and the fourth input terminal + and the setting resistor RSET; that is to say, the output current IAC generated by the measuring current generation circuit 1 is equal to (VIN0−VIP0)/RSET=(VIP1−VIN1)/RSET=VAC/RSET. In detail, the amplitude and frequency of the output current IAC generated by the measuring current generation circuit 1 can be determined according to the differential input voltage signal VAC provided by the differential input voltages VIN1 and VIP1, and the upper and lower limits of the output current IAC can be determined according to the resistance of the setting resistor RSET. Therefore, the measuring current generation circuit 1 can generate different output currents IAC by adjusting the differential input voltages VIN1 and VIP1 and the resistance of the setting resistor RSET.

In addition, the differential input voltages VIN1 and VIP1 can also control the flow direction of the output current IAC generated by the measuring current generation circuit 1. In detail, the flow direction of the output current IAC generated by the measuring current generation circuit 1 can be bidirectional or unidirectional which is determined by the differential input voltage signal VAC provided by the differential input voltages VIN1 and VIP1. The output current IAC generated by the measuring current generation circuit 1 can flow from the second input terminal + of the first transconductance amplifier TA0 to the second output terminal OUT2 of the output circuit 10, or from the second output terminal OUT2 of the output circuit 10 to the second input terminal + of the first transconductance amplifier TA0 without specific limitations. In other words, the output current IAC generated by the measuring current generation circuit 1 can flow from the first measuring terminal IOUTP to the second measuring terminal IOUTN, or from the second measuring terminal IOUTN to the first measuring terminal IOUTP without specific limitations.

In practical applications, the output loads ZL0~ZLN can be a biological tissue (such as a human body, but not limited to this). Since the output current IAC generated by the measuring current generation circuit 1 is an alternating current (AC) current passing through the biological tissue (i.e., the output loads ZL0~ZLN) at different alternating current frequencies, the condition that the impedance of the biological tissue varies with the frequency can be obtained.

Figure 3:
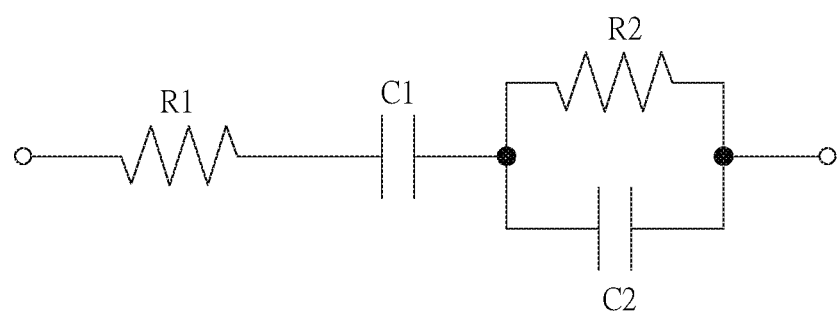
FIG. 3 illustrates an embodiment of the output load in FIG. 2.

In addition, the output loads ZL0~ZLN can be not only resistive loads, but also a combination of multiple resistive loads and capacitive loads. For example, as shown in FIG. 3, the equivalent output load ZL1 of the human body impedance includes resistors R1~R2 and capacitors C1~C2, wherein one terminal of the capacitor C1 is coupled to the resistor R1, the resistor R2 is coupled to the other terminal of the capacitor C1, the capacitor C2 is coupled to the other terminal of the capacitor C1, and the capacitor C2 and the resistor R2 are coupled in parallel, but not limited to this.

Figure 4:
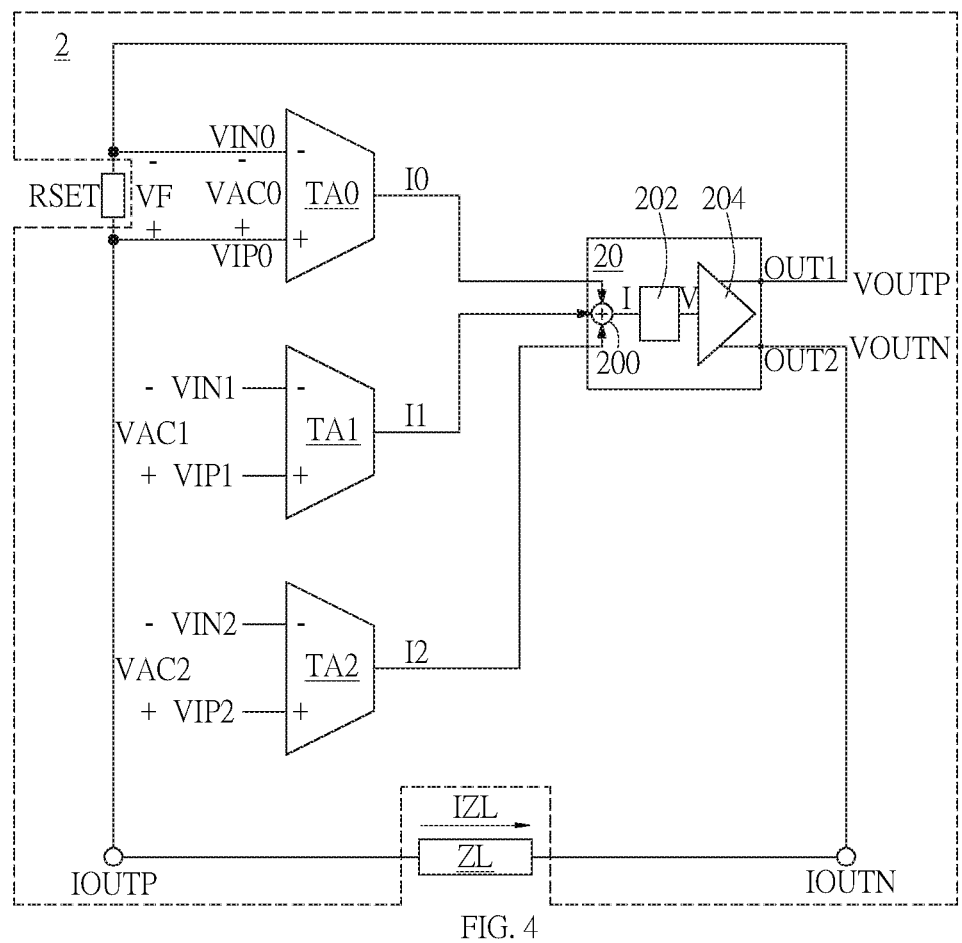
FIG. 4 illustrates a schematic diagram of a measuring current generation circuit coupled to an output load and generating an output current to the output load in another embodiment of the invention.

In another embodiment, as shown in FIG. 4, the measuring current generation circuit 2 is coupled to the setting resistor RSET. The measuring current generation circuit 2 includes a first measuring terminal IOUTP, a second measuring terminal IOUTN, a first transconductance amplifier TA0, a second transconductance amplifier TA1, a third transconductance amplifier TA2 and an output circuit 20. The first transconductance amplifier TA0 is coupled to the setting resistor RSET, the first measuring terminal IOUTP and the output circuit 20. The second transconductance amplifier TA1 is coupled to the output circuit 20. The third transconductance amplifier TA2 is coupled to the output circuit 20. The output circuit 20 is coupled to the output terminal of the first transconductance amplifier TA0, the output terminal of the second transconductance amplifier TA1, the output terminal of the third transconductance amplifier TA2, the setting resistor RSET and the second measuring terminal IOUTN.

The first transconductance amplifier TA0 has a first input terminal − and a second input terminal +. The first input terminal − is coupled to one terminal of the setting resistor RSET and also coupled to the first output terminal OUT1 of the output circuit 20. The second input terminal + is coupled to the other terminal of the setting resistor RSET and also coupled to the first measuring terminal IOUTP. That is to say, the first output terminal OUT1 of the output circuit 20 is feedback coupled to the first input terminal − of the first transconductance amplifier TA0, and the first input terminal − and the second input terminal + of the first transconductance amplifier TA0 are coupled to the two terminals of the setting resistor RSET respectively.

When the first input terminal − and the second input terminal + of the first transconductance amplifier TA0 receive the differential input voltages VIN0 and VIP0, the first transconductance amplifier TA0 generates the first current I0 to the output circuit 20.

The second transconductance amplifier TA1 has a third input terminal − and a fourth input terminal +. When the third input terminal − and the fourth input terminal + of the second transconductance amplifier TA1 receive the differential input voltages VIN1 and VIP1, the second transconductance amplifier TA1 generates the second current I1 to the output circuit 20.

Similarly, the third transconductance amplifier TA2 has a fifth input terminal − and a sixth input terminal +. When the fifth input terminal − and the sixth input terminal + of the third transconductance amplifier TA2 receive the differential input voltages VIN2 and VIP2, the third transconductance amplifier TA2 generates the third current I2 to the output circuit 20.

In this embodiment, the transconductance of the first transconductance amplifier TA0 is equal to the sum of the transconductances of the second transconductance amplifier TA1 and the third transconductance amplifier TA2, resulting in that the voltage difference (VIN0−VIP0) between the first input terminal − and the second input terminal + of the first transconductance amplifier TA0 is equal to the sum of the voltage difference (VIN1−VIP1) between the third input terminal − and the fourth input terminal + of the second transconductance amplifier TA1 and the voltage difference (VIN2−VIP2) between the fifth input terminal − and the sixth input terminal + of the third transconductance amplifier TA2, but their polarities are opposite. Therefore, the cross-voltage VF of the resistor RSET is equal to the sum of the voltage difference between the differential input voltage signal VAC1 provided by the differential input voltages VIP1 and VIN1 and the voltage difference between the differential input voltage signal VAC2 provided by the differential input voltages VIP2 and VIN2, but their polarities are opposite; that is to say, VF=(VIN0−VIP0)=(VIP1−VIN1)+(VIP2−VIN2)=the voltage difference of VAC1+the voltage difference of VAC2.

The output circuit 20 includes an addition circuit 200, a current-to-voltage circuit 202 and an amplifying circuit 204, a first output terminal OUT1 and a second output terminal OUT2. The addition circuit 200 is coupled to the output terminal of the first transconductance amplifier TA0, the output terminal of the second transconductance amplifier TA1, and the output terminal of the third transconductance amplifier TA2 respectively. The current-to-voltage circuit 202 is coupled to the addition circuit 200. The amplifying circuit 204 is coupled to the current-to-voltage circuit 202, the first output terminal OUT1 and the second output terminal OUT2 respectively. The first output terminal OUT1 is coupled to the first input terminal − of the first transconductance amplifier TA0. The second output terminal OUT2 is coupled to the second measuring terminal IOUTN.

When the addition circuit 200 receives the first current I0 outputted by the first transconductance amplifier TA0, the second current I1 outputted by the second transconductance amplifier TA1, and the third current I2 outputted by the third transconductance amplifier TA2 respectively, the addition circuit 200 generates a sum current I according to the first current I0, the second current I1 and the third current I2 and outputs the sum current I to the current-to-voltage circuit 202. The current-to-voltage circuit 202 converts the sum current I into a sum voltage V and outputs the sum voltage V to the amplifying circuit 204. The amplifying circuit 204 generates differential output voltages VOUTP and VOUTN at the first output terminal OUT1 and the second output terminal OUT2 according to the sum voltage V.

When an output load ZL is coupled between the first measuring terminal IOUTP and the second measuring terminal IOUTN, the output current IZL generated between the second input terminal + of the first transconductance amplifier TA0 and the second output terminal OUT2 of the output circuit 10 by the measuring current generation circuit 2 (that is to say, the output current IZL is generated between the first measuring terminal IOUTP and the second measuring terminal IOUTN) will flow through the output load ZL disposed between the first measuring terminal IOUTP and the second measuring terminal IOUTN.

In practical applications, the output current IZL generated by the measuring current generation circuit 2 is related to the differential input voltages VIN1 and VIP1 received by the third input terminal − and the fourth input terminal +, the differential input voltages VIN2 and VIP2 received by the fifth input terminal − and the sixth input terminal + and the setting resistor RSET, wherein the differential input voltages VIN1 and VIP1 are used to provide the differential input voltage signal VAC1 and the differential input voltages VIN2 and VIP2 are used to provide the differential input voltage signal VAC2; the differential input voltage signals VAC1 and VAC2 are used to determine the amplitude and frequency of the output current IZL (AC current); the setting resistor RSET is used to set the upper and lower limits of the current value of the output current IZL. Therefore, the output current IZL generated by the measuring current generation circuit 2 is equal to (VIN0−VIP0)/RSET=[(VIP1−VIN1)+(VIP2−VIN2)]/RSET=(the voltage difference of VAC1+the voltage difference of VAC2)/RSET, but not limited to this.

Since the differential input voltage signal VAC1 provided by the differential input voltage VIN1 and VIP1 received by the third input terminal − and the fourth input terminal + of the second transconductance amplifier TA1 and the differential input voltage signals VAC2 provided by the differential input voltages VIN2 and VIP2 received by the fifth input terminal − and the sixth input terminal + of the third transconductance amplifier TA2 can have different frequencies (or phases), so multiple sets of differential input terminals (for example, four sets of differential input terminals, seven sets of differential input terminals, etc.) can be used in the invention according to practical needs to achieve the synthesis of multi-frequency (or multi-phase) input current, and not limited to the above embodiments.

Compared to the prior art, the measuring current generation circuit of the invention has two sets of differential input terminals and a set of differential output terminals, and the upper and lower limits of the output current can be set by coupling two terminals of the setting resistor to one set of differential input terminals which is feedback coupled with an output terminal, and the amplitude and frequency of the output current can be determined by inputting the differential voltage input signal through the other set of differential input terminals, so as to achieve an AC current generation circuit with characteristics of no switch, high precision and low current.

What is claimed is:

1. A measuring current generation circuit, coupled to a setting resistor, comprising:
  a first measuring terminal;
  a second measuring terminal;
  a first transconductance amplifier having a first input terminal and a second input terminal, wherein the first input terminal is coupled to one terminal of the setting resistor and the second input terminal is coupled to another terminal of the setting resistor and coupled to the first measuring terminal;
  a second transconductance amplifier having a third input terminal and a fourth input terminal, and
  an output circuit, coupled to output terminals of the first transconductance amplifier and the second transconductance amplifier respectively, having a first output terminal and a second output terminal, wherein the first output terminal is coupled to the first input terminal, and the second output terminal is coupled to the second measuring terminal.

2. The measuring current generation circuit of claim 1, wherein the third input terminal and the fourth input terminal receive a differential input voltage signal and a cross-voltage of the setting resistor is generated, the cross-voltage is an AC voltage having the same frequency with the differential input voltage signal.

3. The measuring current generation circuit of claim 2, wherein the cross-voltage of the setting resistor generates an output current at the setting resistor, and the setting resistor is configured to set an upper limit and a lower limit of a current value of the output current.

4. The measuring current generation circuit of claim 2, wherein amplitude and frequency of the output current are determined by the differential input voltage signal.

5. The measuring current generation circuit of claim 1, wherein the output circuit comprises:
   an addition circuit, coupled to output terminals of the first transconductance amplifier and the second transconductance amplifier respectively;
   a current-to-voltage circuit, coupled to the addition circuit; and
   an amplifying circuit, coupled to the current-to-voltage circuit, the first output terminal and the second output terminal respectively.

6. The measuring current generation circuit of claim 2, wherein the differential input voltage signal controls a flow direction of the output current.

7. The measuring current generation circuit of claim 2, wherein transconductances of the first transconductance amplifier and the second transconductance amplifier are equal, and the cross-voltage of the setting resistor and a voltage difference of the differential input voltage signal are equal, but their polarities are opposite.

8. The measuring current generation circuit of claim 1, further comprising:
   a third transconductance amplifier, coupled to the output circuit and having a fifth input terminal and a sixth input terminal, configured to receive a second differential input voltage signal and generate a third current to the output circuit.

9. The measuring current generation circuit of claim 8, wherein a transconductance of the first transconductance amplifier is equal to a sum of transconductances of the second transconductance amplifier and the third transconductance amplifier, a cross-voltage of the setting resistor and a sum of a differential input voltage signal received by the first input terminal and the second input terminal and the second differential input voltage signal are equal, but their polarities are opposite, wherein the differential input voltage signal and the second differential input voltage signal have different frequencies.

* * * * *